United States Patent
Dye

[19]

[11] Patent Number: 6,151,219
[45] Date of Patent: Nov. 21, 2000

[54] ELECTRONIC CARD WITH SHEET METAL AND OVERMOLDED PLASTIC FRAME PARTS

[75] Inventor: David Eugene Dye, Rancho Santa Margarita, Calif.

[73] Assignee: ITT Manufacturing Enterprises, Inc., Wilmington, Del.

[21] Appl. No.: 09/244,564

[22] Filed: Feb. 1, 1999

[51] Int. Cl.[7] .................................................. H05K 5/03
[52] U.S. Cl. .................. 361/737; 361/752; 361/799; 361/801; 174/51; 235/492
[58] Field of Search .................. 361/736, 752, 361/753, 799, 801, 802, 800, 816, 818; 174/35 R, 51; 439/946; 257/679; 235/492; 220/4.02

[56] References Cited

U.S. PATENT DOCUMENTS

| | | | |
|---|---|---|---|
| Re. 35,873 | 8/1998 | Simmons et al. | 361/818 |
| 4,780,791 | 10/1988 | Morita et al. | |
| 5,319,516 | 6/1994 | Perkins | 361/220 |
| 5,330,360 | 7/1994 | Marsh et al. | 439/76 |
| 5,398,154 | 3/1995 | Perkins et al. | 361/212 |
| 5,414,253 | 5/1995 | Baudouin et al. | 235/492 |
| 5,476,387 | 12/1995 | Ramey et al. | 439/76.1 |
| 5,502,620 | 3/1996 | Funck et al. | 361/753 |
| 5,502,892 | 4/1996 | Lien | 361/737 |
| 5,526,227 | 6/1996 | Satou et al. | 361/684 |
| 5,544,007 | 8/1996 | Inoue | 361/684 |
| 5,563,450 | 10/1996 | Bader et al. | 257/785 |
| 5,649,224 | 7/1997 | Scheer | 395/800 |
| 5,653,596 | 8/1997 | Banakis et al. | 439/64 |
| 5,717,573 | 2/1998 | Sadurai | 361/737 |
| 5,726,867 | 3/1998 | Zareii | 361/818 |
| 5,747,735 | 5/1998 | Chang et al. | 174/51 |
| 5,886,402 | 3/1999 | Onoda et al. | 257/679 |

*Primary Examiner*—Jayprakash N. Gandhi
*Attorney, Agent, or Firm*—Thomas L. Peterson

[57] ABSTRACT

An electronic card (10) of the type that fits into a slot of a computer, has top and bottom cover halves (32,34) that each includes flat sheet metal parts (64, 66) and plastic overmolding frames (70, 72) at the edges, where the sheet metal is exposed at groundable regions (50, 52) at the opposite sides of the card. The plastic overmolding forms columns at the top and bottom with the columns (80, 82) having abutting joined surfaces (84, 86) that can be sonically welded together to seal the cover closed. The top sheet metal piece has a downwardly-extending ear (100) supported by the plastic top column, while the bottom sheet metal piece has an upwardly-extending tab (94) supported by the bottom column, with the tab and ear engaging each other to connect the pieces of sheet metal at the top and bottom covers. The tab lies on the outside of the lower column to provide an exposed sheet metal region that can be engaged by a contact on the computer to ground the card. At the grounding region, the bottom column includes a chimney (110) that extends upwardly and immediately outside the top column, with the tab extending up along the outside of the chimney and being bent around the top of the chimney.

7 Claims, 4 Drawing Sheets

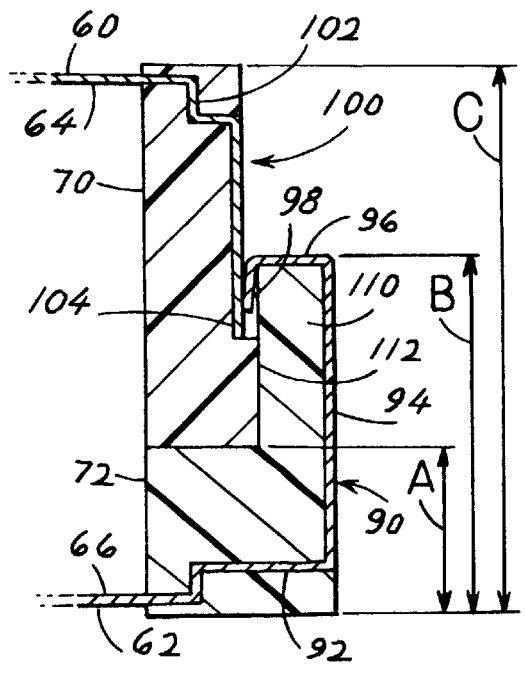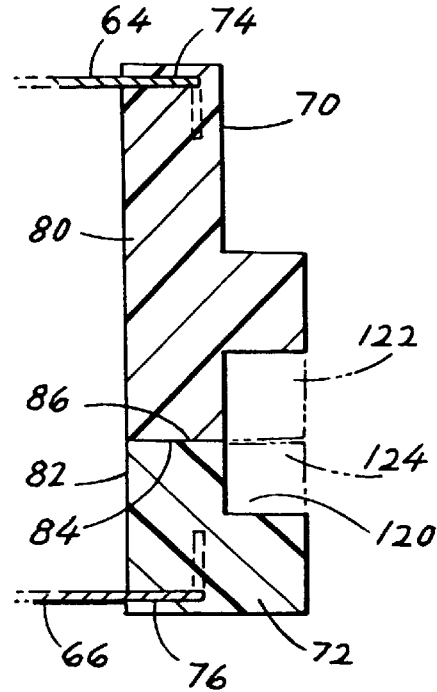
FIG. 3     FIG. 4
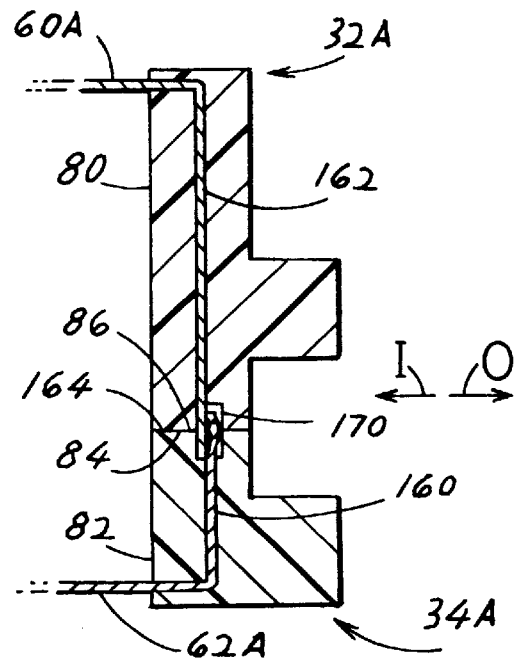
FIG. 7

ELECTRONIC CARD WITH SHEET METAL AND OVERMOLDED PLASTIC FRAME PARTS

BACKGROUND OF THE INVENTION

Electronic cards are inserted into slots of electronic devices such as computers to transfer information between them. One type of electronic card, sometimes referred to as a PC or IC card, includes a sheet metal cover. The cover includes top and bottom sheet metal cover halves which have overlapping sides that are welded together. These parts of the electronic card are sold to companies that make custom circuit boards and that assemble the card parts. Many companies do not have welding equipment. A newer approach is to form the cover halves with sheet metal plate parts for EMI (electromagnetic) shielding at the top and bottom of the card, and to overmold plastic around the edges of the sheet metal. In a sectional view, the plastic overmolding includes a top column at the top cover half and a bottom column at the bottom cover half, with the columns having abutting surfaces that can be sonically welded together. Sonic welding equipment is more readily available and is often preferred to welding equipment. The presence of plastic abutting surfaces that are to be sonically welded, can result in the absence of sheet metal at the sides of the card. Such sheet metal at the side has been useful to provide a grounding surface that can be engaged by a contact of the computer to discharge static electricity. Also, such sheet metal has been used to electrically connect the sheet metal plates at the top and bottom of the card. An electronic card of a type that includes sheet metal plate parts at the top and bottom for providing EMI protection thereat, but with plastic overmolding at the edge portions to enable sonic welding to join the cover halves, but which provided grounding regions at the opposite sides of the card for discharging static electricity from the top and bottom sheet metal plate parts, would be of value.

SUMMARY OF THE INVENTION

In accordance with one embodiment of the present invention, an electronic card is provided of the type that has sheet metal top and bottom plate parts but plastic edge portions that can be sonically welded together, which have grounding regions at the sides in a simple card construction. The bottom sheet metal plate part has an integral tab that projects outwardly through the plastic material to the outside of the card at its side grounding region and which extends upwardly therefrom, to provide a surface that can be brushed against to ground the card. The top sheet metal plate part has an integral top ear that extends through the plastic thereat to the outside of the card and which extends downwardly and lies in contact with the tab.

At the grounding region, the plastic of the lower cover half includes a chimney that extends upwardly and immediately outside the plastic of the top cover half. The tab which extends upwardly along the outside of the chimney, has a top tab portion that is bent around the top of the chimney and that extends downwardly, so contact between the tab and ear of the bottom and top cover halves, occurs in a protected area.

Where side shielding is required for the electronic card, a tab extends upwardly from the edge of the lower sheet metal plate part. The tab extends within a plastic column of the lower cover half to the top thereof. An ear of sheet metal extends down from the edge of the sheet metal at the upper cover part. The ear extends down along a plastic column of the upper cover part, with the top of the tab and bottom of the ear engaging each other.

Where connection of the top and bottom sheet metal plate parts is required, this can be accomplished by a spring that lies in a hole of the plastic columns in the lower and upper cover halves, where the holes extend through to the sheet metal plate parts.

The novel features of the invention are set forth with particularity in the appended claims. The invention will be best understood from the following description when read in conjunction with the accompanying drawings.

BRIEF DESCRIPTION OF THE DRAWINGS

FIG. 3 is a sectional view taken on line 3—3 of FIG. 2.

FIG. 4 is a sectional view taken on line 4—4 of FIG. 2.

FIG. 7 is a sectional view of a portion of an electronic card constructed in accordance with another embodiment of the invention.

DESCRIPTION OF THE PREFERRED EMBODIMENTS

Figure 1:
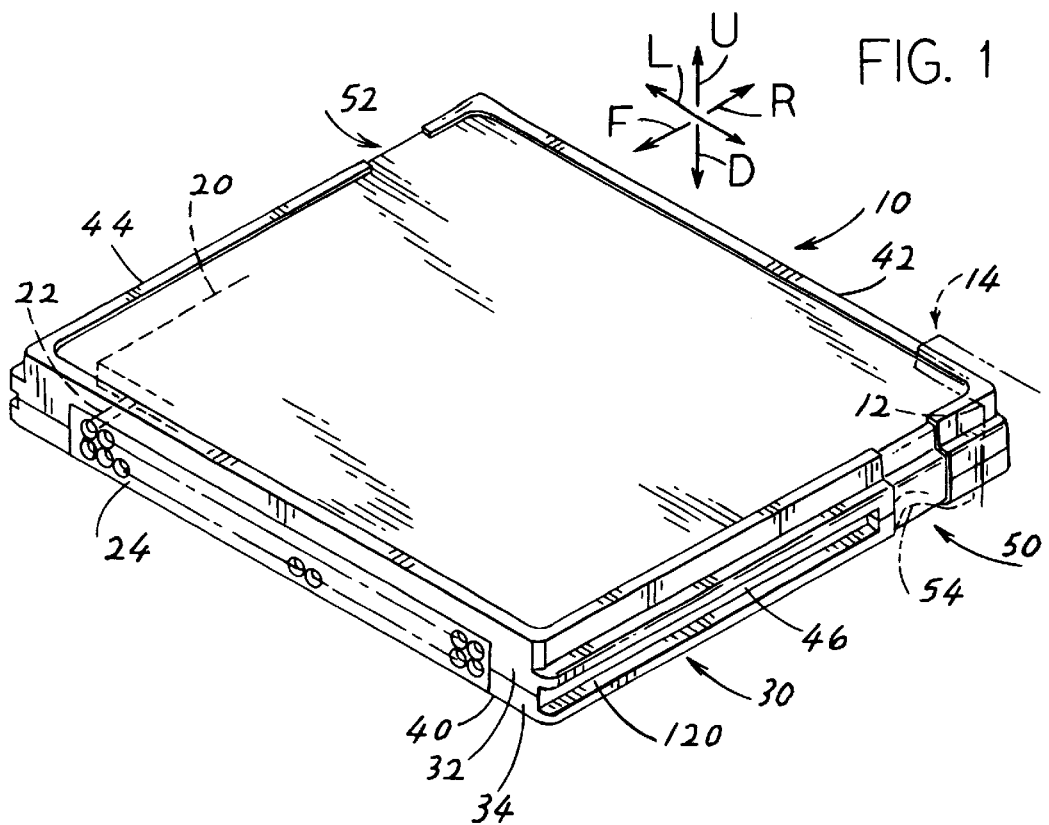
FIG. 1 is a front and top isometric view of an electronic card constructed in accordance with one embodiment of the present invention, and showing, in phantom lines, an electronic device that receives the card.

FIG. 1 illustrates an electronic card 10 of the present invention, which is designed to be inserted in a forward direction F into a slot 12 of a laptop computer or other electronic device 14. The electronic card includes a circuit board 20 that usually (but not always) carries electronic components (integrated circuits, resistors, etc.) and which has traces that connect to contact 22 of a front connector 24 of the card. The circuit board is protected from physical damage and EMI (electromagnetic interference) by a cover assembly 30 that includes top and bottom cover halves 32, 34. The card has front and rear ends 40, 42 and opposite sides 44, 46. A grounding region 50, 52 lies at each side, where a grounding contact 54 of the electronic device can engage the card to discharge any static electricity that is built up on the card and to ground the sheet metal of the cover. It is noted that the rear end 42 of the card may be closed, or may include an I/O (input-output connector) that enables connection of the electronic device to external equipment such as a modem, another computer, etc.

Figure 2:
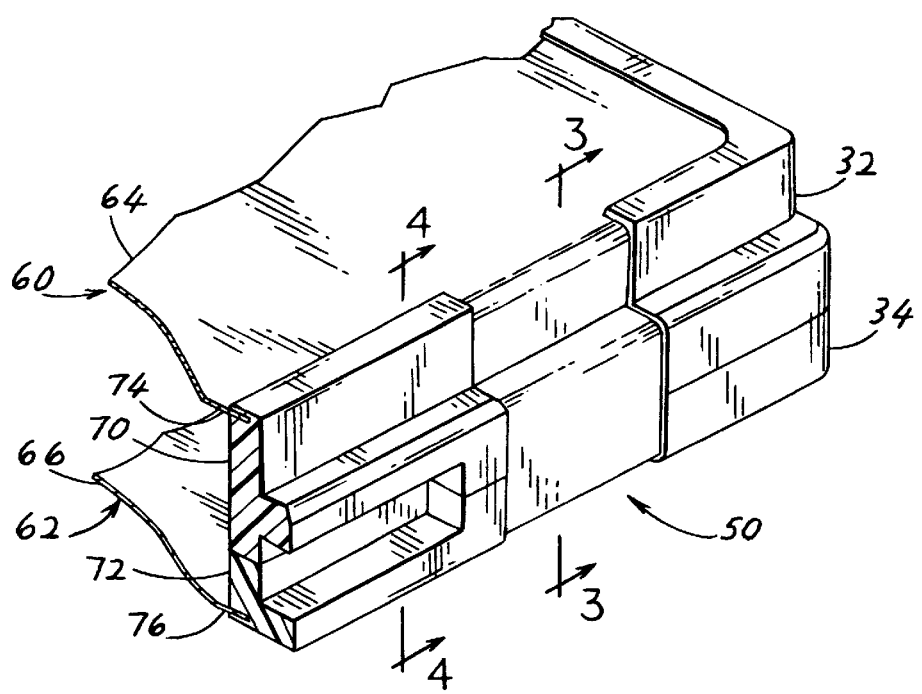
FIG. 2 is a partial enlarged view of the card of FIG. 1, showing the grounding region thereof.

As shown in FIG. 2, the top and bottom cover halves 32, 34 include pieces of sheet metal or sheet metal portions 60, 62 that have plate-like parts 64, 66. The plate-like parts 64, 66 cover areas above and below the circuit board to protect it from EMI. The upper and lower cover halves also include plastic, or polymer frame parts 70, 72 that are overmolded around edge portions 74, 76 of the sheet metal plate-like parts 64, 66.

As shown in FIG. 4, the upper polymer frame part 70 forms a column 80 that extends downwardly from the sheet metal plate part edge portion 74. Similarly, the lower polymer frame part 72 forms an upwardly-extending column 82 that extends upwardly from the lower sheet metal edge portion 76. The columns form abutting plastic joint surface 84, 86 that can be easily joined by sonic welding. In sonic welding, a pair of sound passing members are pressed, one against the bottom of the lower cover half and the other against the top of the upper cover half, the member pressing against the plastic overmolding frame portions. Sonic energy is transmitted between the sound-passing members to sonically weld at the surfaces 84, 86. This joining technique is preferred in many cases, because of the low cost equipment and ease of use.

Static electricity sometimes builds up on the sheet metal plate parts 64, 66, and should be discharged when the card is inserted into a slot in the electronic device. FIG. 3 shows a cross section of the card cover at the grounding region 50 where static electricity can be discharged. At the grounding region 50, the sheet metal piece 62 of the lower cover half is provided with a tab 90 that is integral with the plate-like portion 66. The tab has a lower part 92 that extends through the plastic to the extreme outside of the cover, and the tab has an exposed tab part 94 that extends upwardly along the outside of the cover. The exposed tab part 94 wipes across a grounding contact of the electronic device into which the card is inserted to discharge static buildup. The tab includes a free end portion 96 that is bent and that has a downwardly-extending end 98 for engaging the sheet metal of the upper cover half.

The sheet metal piece 60 of the upper cover half includes an ear 100 with a top ear part 102 that extends through the plastic to the outside of the upper polymer frame part 70 and that extends downward therealong so the bottom 104 of the ear is positioned to engage the end 98 of the tab. This construction results in the top and bottom plate-like parts 64, 66 being electrically connected together, and with an exposed tab part 94 at the side of the frame which can be readily grounded by a contact of the electronic device that receives the card.

Applicant supports the exposed tab portion 94 and the free end portion 96 by providing the polymer bottom frame part 72 with a chimney 110. The chimney extends upwardly along the outer surface 112 of the polymer upper frame part 70. The free end portion 96 of the tab is bent around the top of the chimney and engages the top ear 100.

The chimney 110 lies only at the grounding region 50. As shown in FIG. 1, much of the length of the card from its front end, has a groove 120 for receiving a key of the electrical device 14 that assures that the card is not inserted upside down. FIG. 4 shows the cross section along this region. FIG. 1 shows that, rearward of the grounding regions 50, 52, there is no groove. FIG. 4 shows that where there is no groove 120, each of the columns 80, 82 of the cover halves include column parts 122, 124. The parts 122, 124 form additional areas of the junction surface 84, 86 where the cover halves are sonically welded together. The chimneys 110 of FIG. 3 (and at the other side) serve not only to support the exposed tab portions 94, but also can be used to align the top and bottom cover halves during assembly.

Figure 6:
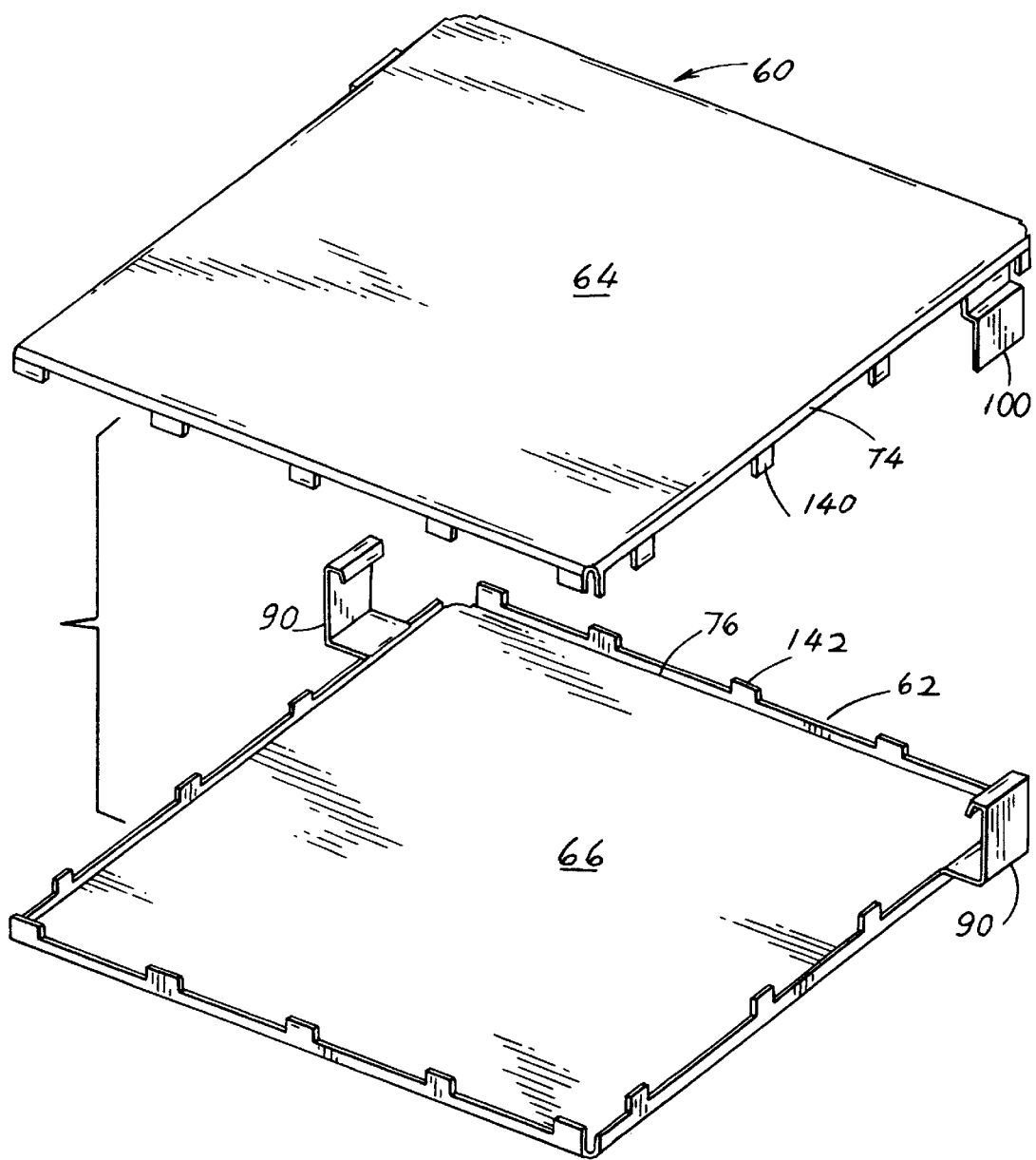
FIG. 6 is an exploded isometric view of only the sheet metal portions of the top and bottom cover halves of FIG. 5.

FIG. 6 shows the shape of the top and bottom sheet metal portions or pieces 60, 62 that each includes a plate-like sheet metal part 64, 66. It is noted that the edge portions 74, 76 include short fingers 140, 142 that project into the plastic to help anchor the plastic to the sheet metal. The shapes of the tabs 90 and ears 100 can also be seen.

Figure 5:
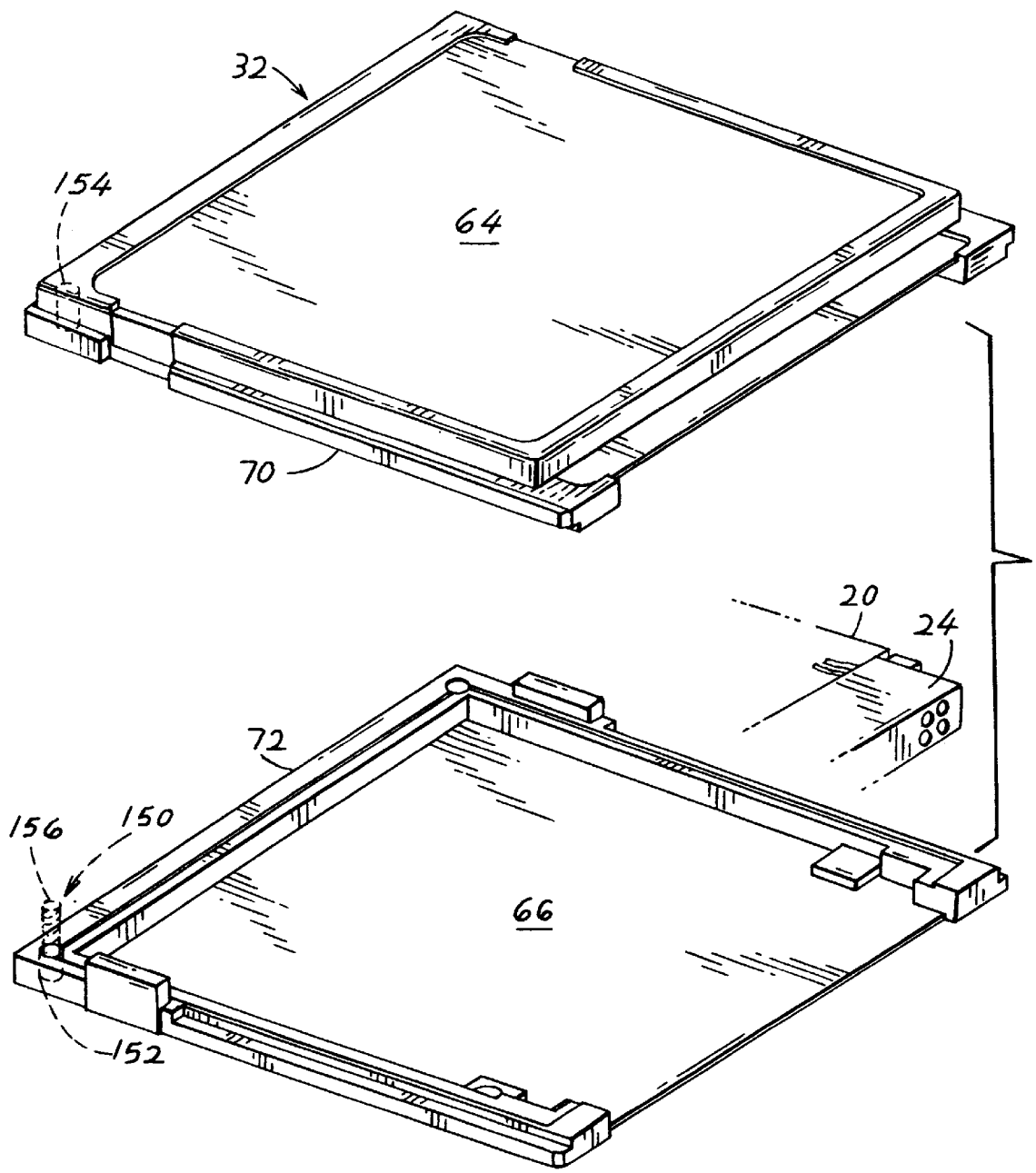
FIG. 5 is an exploded isometric view of a portion of the card of FIG. 1, showing the top and bottom cover halves and a portion of the circuit board and front connector thereof.

FIG. 5 shows the cover separated, and shows a portion of the front connector 24 and of the circuit board 20 that lies between the cover halves. In some cases, where the top and bottom plate-like sheet metal parts 64, 66 are not reliably connected at grounding regions, a clip or spring can be used to connect the top and bottom sheet metal plate parts. FIG. 5 shows a tapered coil spring 150 which is used to connect the sheet metal parts 64, 66. The plastic frame parts 70, 72 of the cover halves are provided with holes 152, 154. When the spring is compressed, its lower end engages the sheet metal plate-like part 66 of the lower cover half and the sheet metal plate-like part 64 of the upper cover half. Although springs are known for electrically connecting upper and lower sheet metal parts, the placement of the spring 150 of the present invention, minimizes the space occupied by the spring and any guard around it, by placing the holes in the plastic frame parts. The upper portion 156 of the spring is tapered, so it can readily fit into the hole 154 when the cover halves are brought together.

In some applications, where high bit rates are transmitted so that the leading and trailing edges of pulses have high frequency components, shielding may be necessary around the sides of the card. FIG. 7 shows a construction wherein sheet metal pieces or portions 60A, 62A of the cover halves 32A 34A, are respectively provided with tabs 160 and ears 162 that form side shielding for the card. The tabs extend upwardly and the ears 162 extend downwardly, with at least one of them and preferably both of them projecting beyond the interface 164 where joined surface 84, 86 of the columns 80, 82 abut one another and can be sonically welded together. Preferably, an opening 170 is provided in at least one of the joined surfaces, so the top of the tab 160 can flex.

While terms such as "top", "bottom", etc. have been used to describe the relative positions of the parts, it should be understood that the card can be used in any orientation with respect to the Earth.

Thus, the invention provides an electronic card with a cover that has sheet metal plate parts at at least the top and bottom and plastic overmolded frame parts at the edges of the sheet metal to enable sonic welding, which provides improved grounding and shielding. At grounding regions at one and preferably both opposite sides of the card, a tab extending from one of the covers such as the lower one, extends to the outside of the card but is backed by a plastic frame part. The bottom plastic frame part can include an upstanding chimney that extends upward of and against a downwardly-extending plastic column of the upper frame part, with a tab of the lower sheet metal portion extending through the lower frame part and along the chimney, and with the top of the tab being bent around the chimney. The upper cover half includes a sheet metal ear that extends downwardly along the outside of the upper column and directly engages the bent-around upper portion of the tab. Where continuous sheet metal EMI protection is required at the sides of the card, this can be accomplished by upstanding sheet metal tabs in the bottom cover half and downwardly-extending sheet metal ears on the upper cover half, which extend within the columns of the plastic frame parts and which engage one another. Where the top and bottom sheet metal portions must be separately electrically connected, this can be accomplished by a spring that extends through holes in the plastic frame parts of the upper and lower cover halves to contact the sheet metal plate parts, to save space.

Athough particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electronic card for fitting into a card-receiving slot of an electronic device that has a grounding contact, comprising:

a circuit board;

top and bottom cover halves that include sheet metal portions with largely plate-like sheet metal parts that lie respectively above and below said circuit board, with said sheet metal portions being electrically connected together, with each cover half including a polymer frame part overmolded around edge portions of said sheet metal portions, with top and bottom polymer frame parts of said top and bottom cover halves having joint surfaces that can abut one another to be sonically welded together to form a frame that has front and rear ends and opposite sides and that has an outside that is exposed;

said bottom sheet metal part includes an integral bottom tab with a first tab part (92) that extends largely horizontally through said bottom polymer frame part, with polymer material of said bottom polymer frame part lying both above and below said first tab part, and with a second tab part (94) that lies at and is exposed at said outside of said frame to enable its engagement by said grounding contact of said electronic device, whereby to enable sonic welding of the cover halves while providing a side metal ground integral with the sheet metal of one of said cover halves.

2. The card described in claim 1 wherein:

said top sheet metal part has an edge and has an integral top ear with a first part (102) of said ear that extends largely horizontal through said top polymer frame part to the outside of said frame, and with a second part of said ear that extends largely downwardly and that engages said bottom tab.

3. An electronic card compromising:

top and bottom cover halves that each includes a sheet metal piece with a largely planar sheet metal plate having front, rear, and side plate edge portions with said sheet metal plates of said cover halves lying substantially in spaced parallel planes, with each cover half having a plastic frame part over-molded around said plate edge portions and with said top plastic frame part having a downwardly extending top column and with said bottom plastic frame part having on upwardly extending bottom column, with said columns forming abutting plastic joint surface that are sonically weldable together;

said top sheet metal piece has a primarily downwardly extending ear that extends through said top column, with plastic material of said top plastic frame part lying on opposite faces of said top sheet metal ear along at least part of its length, and said bottom sheet metal piece has a primarily upwardly extending tab that extends through said bottom column and engages said ear, with plastic material of said top plastic frame part that engages said tab lying on opposite faces of said top sheet metal piece along at least part of its length.

4. An electronic card for fitting into a card-receiving slot of an electronic device that has a grounding contact, comprising:

a circuit board;

top and bottom cover halves that include sheet metal portions with largely plate-like sheet metal parts that lie respectively above and below said circuit board, with said sheet metal portions being electrically connected together, with each cover half including a polymer frame part overmolded around edge portions of said sheet metal portions, with the polymer frame parts of said cover halves having joint surfaces that can abut one another to be sonically welded together to form a frame that has front and rear ends and opposite sides;

said bottom sheet metal part includes an integral bottom tab that lies at and is exposed at a first of said sides of said frame to enable its engagement by said grounding contact of said electronic device, whereby to enable sonic welding of the cover halves while providing a side metal ground integral with the sheet metal of one of said cover halves.

said polymer frame part of said bottom cover half includes an upstanding chimney that has inner and outer sides and a chimney top and said chimney supports said bottom tab and lies immediately outside said polymer frame part of said top cover half;

said bottom tab has a free end portion that is bent around said chimney top, and said bottom tab free end portion has an end part that extends largely downward along said chimney inner side.

5. The card described in claim 4 wherein:

said sheet metal portion of said top cover half includes an ear that extends largely downwardly and that has a bottom that lies between said chimney inner side and the polymer frame part of said top cover half, with the bottom of said ear engaging said tab free end part that extends largely downwardly along said chimney inner side.

6. An electronic card compromising:

top and bottom cover halves that each includes a sheet metal piece with a largely planar sheet metal plate having front, rear, and side plate edge portions with said sheet metal plates of said cover halves lying substantially in spaced parallel planes, with each cover half having a plastic frame part over-molded around said plate edge portions and with said top plastic frame part having a downwardly extending top column and with said bottom plastic frame part having on upwardly extending bottom column, with said columns forming abutting plastic joint surface that are sonically weldable together;

said top sheet metal piece has a downwardly extending ear supported by said top column and said bottom sheet metal piece has an upwardly extending tab supported by said bottom column, and with said ear and tab engaging each other;

said top and bottom cover halves have opposite sides with groundable regions;

at said groundable regions, said bottom column has a chimney that extends upwardly and lies immediately outside said lower column, and said tab extends on the outside of said chimney.

7. The card described in claim 6 wherein:

said chimney has a top and said tab has an upper end portion that is bent around the top of said chimney with said tab upper end portion having a tab free end that lies inside said chimney;

at said groundable region said ear lies on the outside of said top column and engages said top column and said tab free end.

* * * * *